US008923058B2

(12) United States Patent
Lee et al.

(10) Patent No.: US 8,923,058 B2
(45) Date of Patent: Dec. 30, 2014

(54) NONVOLATILE MEMORY DEVICE

(71) Applicant: Samsung Electronics Co., Ltd., Gyeonggi-do (KR)

(72) Inventors: Changyun Lee, Gyeonggi-do (KR); Yoocheol Shin, Gyeonggi-do (KR); Jungdal Choi, Gyeonggi-do (KR)

(73) Assignee: Samsung Electronic Co., Ltd., Suwon-si, Gyeonggi-do (KR)

(*) Notice: Subject to any disclaimer, the term of this patent is extended or adjusted under 35 U.S.C. 154(b) by 24 days.

(21) Appl. No.: 13/653,798

(22) Filed: Oct. 17, 2012

(65) Prior Publication Data

US 2013/0100742 A1 Apr. 25, 2013

(30) Foreign Application Priority Data

Oct. 24, 2011 (KR) .................. 10-2011-0108618

(51) Int. Cl.
| | | |
|---|---|---|
| G11C 16/04 | (2006.01) |
| G11C 5/06 | (2006.01) |
| G11C 5/02 | (2006.01) |
| G11C 5/04 | (2006.01) |
| G11C 11/34 | (2006.01) |

(52) U.S. Cl.
CPC ...... *G11C 11/34* (2013.01); *G11C 5/06* (2013.01); *G11C 5/025* (2013.01); *G11C 16/0483* (2013.01); *G11C 5/02* (2013.01)
USPC .............. 365/185.17; 365/185.18; 365/51; 365/72; 365/174; 257/314

(58) Field of Classification Search
CPC ........ G11C 16/0483; G11C 5/02; G11C 5/06; G11C 5/025
USPC .............. 365/185.17, 185.18, 185.24, 72, 51, 365/174
See application file for complete search history.

(56) References Cited

U.S. PATENT DOCUMENTS

| | | | |
|---|---|---|---|
| 6,151,249 A | 11/2000 | Shirota et al. | |
| 6,762,955 B2 | 7/2004 | Sakui et al. | |
| 7,227,781 B2 | 6/2007 | Iizuka | |
| 2011/0149655 A1* | 6/2011 | Tanzawa .................. | 365/185.17 |
| 2012/0280304 A1* | 11/2012 | Lee et al. ..................... | 257/316 |
| 2013/0092994 A1* | 4/2013 | Shim et al. ................... | 257/314 |
| 2013/0163325 A1* | 6/2013 | Noh .......................... | 365/185.02 |

FOREIGN PATENT DOCUMENTS

KR 10-2010-0039704 A 4/2010

* cited by examiner

*Primary Examiner* — Ly D Pham
(74) *Attorney, Agent, or Firm* — F. Chau & Associates, LLC

(57) ABSTRACT

A nonvolatile memory device is provided. The device may include a plurality of cell strings that are configured to share a bit line, word lines, and selection lines. Each of the cell strings may include a plurality of memory cells connected in series to each other and a string selection device controlling connections between the memory cells and the bit line, and the string selection device may include a first string selection element with a first threshold voltage and a second string selection element connected in series to the first string selection element and having a second threshold voltage different from the first threshold voltage. At least one of the first and second string selection elements may include a plurality of switching elements connected in series to each other.

14 Claims, 18 Drawing Sheets

NONVOLATILE MEMORY DEVICE

CROSS-REFERENCE TO RELATED APPLICATIONS

This U.S. non-provisional patent application claims priority under 35 U.S.C. §119 to Korean Patent Application No. 10-2011-0108618, filed on Oct. 24, 2011, in the Korean Intellectual Property Office, the entire contents of which are hereby incorporated by reference.

BACKGROUND

Embodiments of the inventive concept relate generally to semiconductor memory devices. More particularly, embodiments of the inventive concept relate to nonvolatile memory devices with improved reliability.

Generally, integrated circuit memory devices can be classified into volatile memory devices and nonvolatile memory devices. Upon power-off, the volatile memory devices lose stored data, but the nonvolatile memory devices maintain stored data.

Flash memory devices are nonvolatile memory devices and generally include NOR and NAND types. The NOR type, with capability of independent control between memory cells, can operate at relatively high speed. The NAND type can control a string of a plurality of memory cells, providing relatively high integration density.

SUMMARY

Embodiments of the inventive concept provide nonvolatile memory devices with improved reliability.

According to an exemplary embodiment of the inventive concept, a nonvolatile memory device may include a plurality of cell strings that are configured to share a bit line, word lines, and selection lines. Each of the cell strings may include a plurality of memory cells connected in series to each other and a string selection device controlling connections between the memory cells and the bit line, and the string selection device may include a first string selection element with a first threshold voltage and a second string selection element connected in series to the first string selection element and having a second threshold voltage different from the first threshold voltage. At least one of the first and second string selection elements may include a plurality of switching elements connected in series to each other.

According to an exemplary embodiment of the inventive concept, a nonvolatile memory device may include first and second cell strings that are configured to share a bit line, word lines, and first and second selection lines. The word lines and the first and second selection lines are provided on a semiconductor layer, which may include channel doped regions located under the first string selection line of the first cell string and the second string selection line of the second cell string. At least one of the first and second selection lines may include a plurality of gate lines, each of which has the same width as the word line.

BRIEF DESCRIPTION OF THE DRAWINGS

Exemplary embodiments will be more clearly understood from the following brief description taken in conjunction with the accompanying drawings.

DETAILED DESCRIPTION

Figure 1:
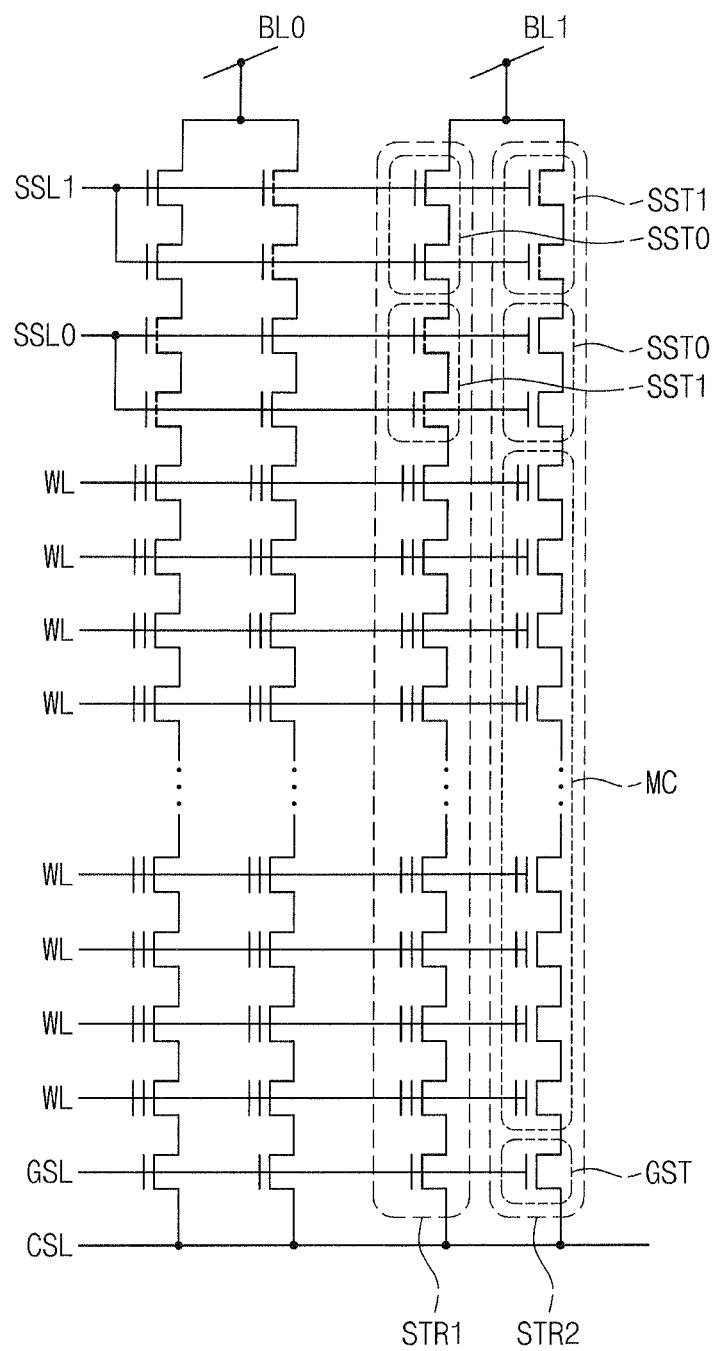
FIG. 1 is a circuit diagram of nonvolatile memory devices according to a first embodiment of the inventive concept.

Exemplary embodiments of the inventive concept will now be described in detail with reference to the accompanying drawings. Exemplary embodiments of the inventive concept may, however, be embodied in many different forms and should not be construed as being limited to the embodiments set forth here. In the drawings, the thicknesses of layers and regions are exaggerated for clarity. Like reference numerals in the drawings may denote like or similar elements throughout the specification and the drawings.

It will be understood that when an element is referred to as being "connected" or "coupled" to another element, it can be directly connected or coupled to the other element or intervening elements may be present.

As used herein, the singular forms "a," "an" and "the" may include the plural forms as well, unless the context clearly indicates otherwise.

FIG. 1 is a circuit diagram illustrating a nonvolatile memory device according to an embodiment of the inventive concept.

Referring to FIG. 1, a nonvolatile memory device includes a plurality of bit lines BL0 and BL1, a common source line CSL, and a plurality of cell strings STR1 and STR2 provided between the common source line CSL and the bit lines BL0 and BL1. The cell strings STR1 and STR2 are connected in parallel to the common source line CSL or each of the bit lines BL0 and BL1.

In an embodiment, a plurality of the cell strings STR1 and STR2 are jointly connected to each of the bit lines BL0 and BL1. The cell strings STR1 and STR2 may be connected in common to the common source line CSL. For example, a plurality of the cell strings STR0 and STR1 are disposed between each of the bit lines BL0 and BL1 and the common source line CSL as shown in FIG. 1.

String selection lines SSL0 and SSL1 are shared by a plurality of the cell strings STR1 and STR2 sharing one of the bit lines BL0 and BL1. For example, the string selection lines SSL0 and SSL1 are configured to control electric connections between the cell strings STR1 and STR2 and one of the bit lines BL0 and BL1.

In an embodiment, each of the cell strings STR1 and STR2 includes a string selection device connected to a corresponding one of the bit lines BL0 and BL, a ground selection device connected to the common source line CSL, and a plurality of memory cells MC connected in series to the string selection device and the ground selection device. In an embodiment, the string selection device includes a plurality of string selection elements SST0 and SST1 connected in series to each other. According to an embodiment, each of the string selection elements SST and SST1 includes at least one string selection transistor. The ground selection device includes at least one ground selection element GST. According to an embodiment, the ground selection element GST includes at least one ground selection transistor.

According to an embodiment, a ground selection line GSL, a plurality of word lines WL, and a plurality of string selection lines SSL0 and SSL1, which are disposed between the common source line CSL and the bit lines BL0 and BL1, function as or are connected to gate electrodes of the ground selection element GST, the memory cells MC, and the string selection elements SST0 and SST1, respectively.

For instance, the string selection lines SSL0 and SSL1 are configured to control an electric connection between the bit lines BL0 and BL1 and the cell strings STR0 and STR1, and the ground selection line GSL is configured to control an electric connection between the cell strings STR0 and STR1 and the common source line CSL. The word lines WL are configured to control the memory cells MC coupled to the word lines WL, respectively. Each of the memory cells MC includes a data storage element.

In an embodiment, the number of the string selection elements included in each cell string is equal to or greater than the number of the cell strings connected to each bit line. For instance, as shown in FIG. 1, each of the first and second strings STR1 and STR2 include the first and second string selection elements SST0 and SST1 connected in series to each other.

The string selection elements included in each cell string have different threshold voltages from each other. For instance, a threshold voltage of the first string selection element SST0 is greater than a threshold voltage of the second string selection element SST1. Alternatively, the threshold voltage of the first string selection element SST0 is smaller than the threshold voltage of the second string selection element SST1.

In an embodiment, the first string selection element SST0 is different from the second string selection element SST1 in terms of a polarity of a threshold voltage. For example, the first string selection element SST0 has a positive threshold voltage (e.g., of about 1V), and the second string selection element SST1 has a negative threshold voltage (e.g., of about −1V). According to an embodiment, the first string selection element SST0 is turned on when the string selection element SST0 is applied with a bias voltage of about 1V or more (e.g., about 1 to about 3V), and the second string selection element SST1 is turned on when the string selection element SST1 is applied with a bias voltage ranging from about −1V to about 1V (e.g., about 0V).

For example, the string selection elements SST0 and SST1 included in one of the cell strings STR0 and STR1 include at least one enhancement-mode transistor and at least one depletion-mode transistor. In an embodiment, the first string selection element SST0 includes an enhancement-mode transistor, and the second string selection element SST1 includes a depletion-mode transistor. According to an embodiment, a threshold voltage of the depletion-mode transistor has a negative polarity and is smaller than a threshold voltage of the enhancement-mode transistor. According to an embodiment, the depletion-mode transistor has a high sub-threshold leakage current. In the depletion-mode transistor, a channel doped region has the same conductivity type as source and drain electrodes regions. For example, according to an embodiment, an n-doped region is used as a channel region in an NMOS transistor. As a result, the depletion-mode transistor behaves like a resistor at zero gate bias.

In an embodiment, the first and second cell strings STR1 and STR2 each include the first and second string selection elements SST0 and SST1 whose threshold voltages are different from each other. The first and second cell strings STR1 and STR2 are connected in common to one of bit lines BL0 and BL1. The first string selection element SST0 of the first cell string STR1 is connected to one of the bit lines BL0 and BL1, and the second string selection element SST1 of the second cell string STR2 is connected to one of the bit lines BL0 and BL1. Each of the string selection lines SSL0 and SSL1 are shared by a plurality of cell strings including the cell strings STR1 and STR2 and are thus connected to at least one of the first string selection elements SST0 and at least one of the second string selection elements SST1. In an embodiment, the first and second string selection elements SST0 and SST1 have different threshold voltages from each other.

The first string selection element SST0 of the first cell string STR1 and the second string selection element SST1 of the second cell string STR2 are controlled by the second string selection line SSL1. The second string selection element SST1 of the first cell string STR1 and the first string selection element SST0 of the second cell string STR2 are controlled by the first string selection line SSL0.

Since the first and second string selection elements SST0 and SST1 have different threshold voltage from each other, the string selection elements SST0 and SST1 can be configured to perform different operations from each other, although the string selection elements SST0 and SST1 are controlled by the same string selection line. For example, electric connections between the first and second cell strings STR1 and STR2 and one of the bit lines BL0 and BL1 can be selectively controlled by voltages applied to the first and second string selection line SSL0 and SSL1. For example, one of the first and second cell strings STR1 and STR2 can be selectively connected to the bit line BL0 or BL1.

In an embodiment, the first and second string selection elements SST0 and SST1 include a plurality of field effect transistors (FETs). For example, as shown in FIG. 1, the first and second string selection elements SST0 and SST1 include two FETs. The gate electrodes of the two FETs are connected jointly to one of the first and second string selection line SSL0 and SSL1, and thus the two FETs behave like a single transistor.

In an embodiment, the first string selection element SST0 includes two enhancement-mode FETs, and the second string selection element SST1 includes, two depletion-mode FETs.

Figure 2:
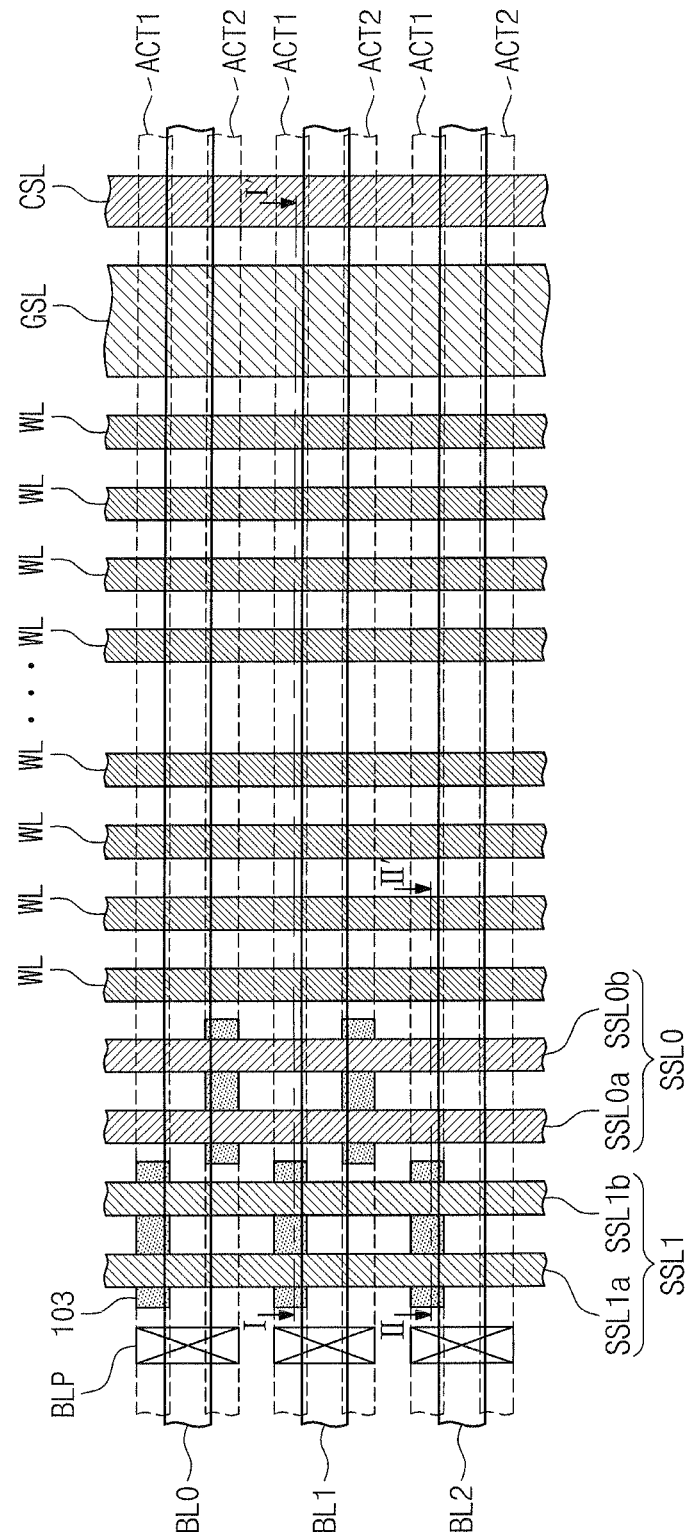
FIG. 2 is a plan view of the nonvolatile memory devices according to the first embodiment of the inventive concept.
Figure 3:
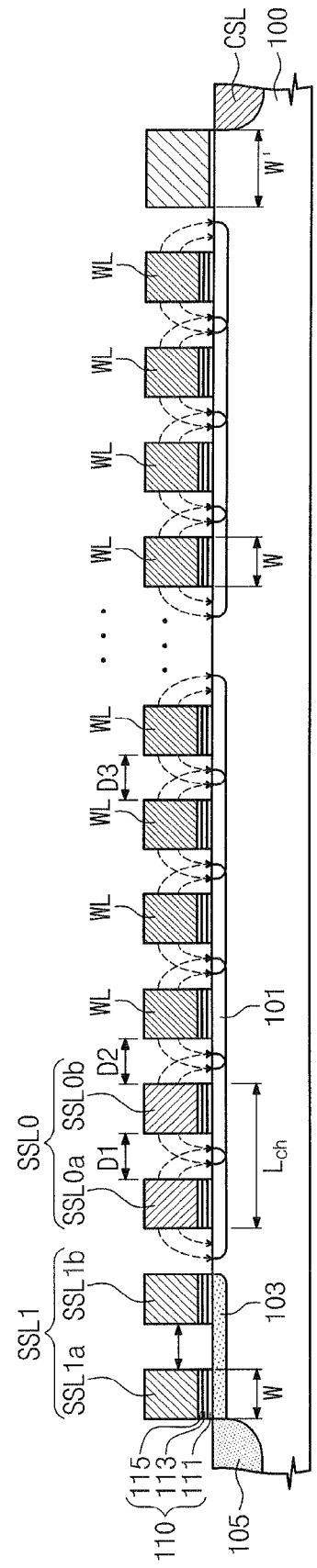
FIG. 3 is a sectional view of the nonvolatile memory devices according to the first embodiment of the inventive concept, which may be taken along a line I-I' of FIG. 2.
Figure 4:
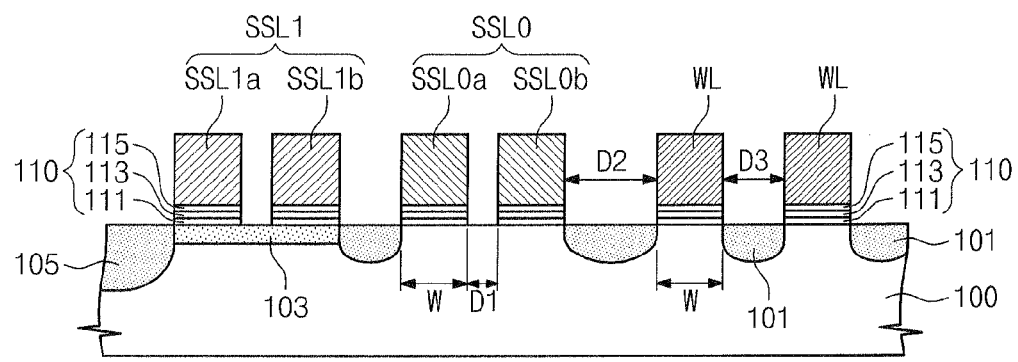
FIG. 4 is a sectional view of nonvolatile memory devices modified from the first embodiment of the inventive concept, which may be taken along a line II-II' of FIG. 2.

FIG. 2 is a plan view illustrating a nonvolatile memory device according to an embodiment of the inventive concept. FIG. 3 is a sectional view illustrating a nonvolatile memory device according to an embodiment of the inventive concept. For example, FIG. 3 is a sectional view taken along a line of FIG. 2. FIG. 4 is a sectional view of a nonvolatile memory device according to an embodiment of the inventive concept. For example, FIG. 4 is a sectional view taken along a line II-II' of FIG. 2.

Referring to FIGS. 2 and 3, a semiconductor layer 100 includes first and second active regions ACT1 and ACT2 that are defined by a device isolation layer (not shown) to have a linear shape. The first and second active regions ACT1 and ACT2 are alternatingly arranged to be parallel to each other and are spaced apart from each other by a predetermined space as shown in FIG. 2. According to an embodiment, the semiconductor layer 100 includes a single crystalline silicon wafer or a single crystalline epitaxial layer.

A plurality of word lines WL, a plurality of string selection lines SSL0 and SSL1, and a ground selection line GSL are provided on the semiconductor layer 100 to cross the first and second active regions ACT1 and ACT2.

In an embodiment, the first and second string selection lines SSL0 and SSL1 are provided adjacent to each other, and the word lines WL are provided between the first string selection line SSL0 and the ground selection line GSL.

In an embodiment, a voltage applied to the word lines WL forms an inversion layer (e.g., channel region 101) in the semiconductor layer 100. Due to the presence of an electric fringe field, the channel region 101 is laterally extended from regions below the word lines WL to regions of the semiconductor layer 100 between the word lines WL. As a result of the formation of the extended portions, the channel regions 101 can overlap each other, and thus, the memory cells MC are connected in series with each other.

In an embodiment, doped regions are formed in the first and second active regions ACT1 and ACT2 (for example, between the word lines WL and between the word lines WL and the string and ground selection lines SSL0, SSL1 and GSL). The doped regions are formed to have a different conductivity type from the semiconductor layer 100.

A drain region 105 doped with impurities is formed in the semiconductor layer 100 at a side of the second string selection line SSL1, and a source region doped with impurities is formed (e.g., in the first and second active regions ACT1 and ACT2 below the common source line CSL) at a side of the ground selection line GSL. The drain region 105 and the source region are formed to have a different conductivity type from the semiconductor layer 100. The drain region 105 and the source region are formed to have an impurity concentration higher than an impurity concentration of the doped regions 101.

A common source line CSL is provided in the semiconductor layer 100 at a side of the ground selection line GSL. The common source line CSL connects the source regions of the ground selection elements GST (e.g., of FIG. 1) to each other. The bit lines BL0 and BL1 are provided to cross the word lines WL, the first and second string selection lines SSL0 and SSL1 and the ground selection line GSL.

Each of the bit lines BL0 to BL2 is connected in common to the drain regions 105 of the first and second string selection elements SST0 and SST1, which are formed in the first and second active regions ACT1 and ACT2, respectively, through a bit line contact plug BLP.

According to an embodiment, the word lines WL function as or are connected to gate electrodes of the memory cells MC (e.g., of FIG. 1), and the first and second string selection lines SSL0 and SSL1 and the ground selection line GSL function as or are connected to gate electrodes of the first and second string selection elements SST0 and SST1 and the ground selection element GST. In an embodiment, the extended portions of the channel regions 101 are used to connect the adjacent memory cells MC in series to each other.

A data storing layer 110 is provided between the semiconductor layer 100 and each of the word lines WL. For example, the data storing layer 110 includes one of a charge-trapping insulating layer, a floating gate electrode, or a material containing conductive nano dots.

When the data storing layer 110 includes a charge storing layer 113, data to be stored in the data storing layer 110 can be changed using Fowler-Nordheim (FN) tunneling that is induced by a voltage difference between the semiconductor layer 100 and the word lines WL.

In an embodiment, the data storing layer 110 includes a tunnel insulating layer 111, a charge storing layer 113, and a blocking insulation layer 115, which are sequentially stacked on the semiconductor layer 100.

The tunnel insulating layer 111 is formed of a material having a dielectric constant smaller than a dielectric constant of the blocking insulation layer 115. According to an embodiment, the tunnel insulating layer 111 includes, for example, at least one of oxide, nitride or oxynitride.

The charge storing layer 113 includes an insulating layer (e.g., a silicon nitride layer) having many charge trap sites or an insulating layer containing conductive grains. In an embodiment, the tunnel insulating layer 111 includes a silicon oxide layer, the charge storing layer 113 includes a silicon nitride layer, and the blocking insulation layer 115 includes at least one insulating layer including an aluminum oxide layer.

The blocking insulation layer 115 includes at least one of silicon oxide, silicon nitride, silicon oxynitride, or high-k dielectrics. For example, the blocking insulation layer 115 includes a multilayered structure. The high-k dielectric includes an insulating material, whose dielectric constant is higher than a dielectric constant of silicon oxide. For example, the high-k dielectric includes tantalum oxide, titanium oxide, hafnium oxide, zirconium oxide, aluminum oxide, yttrium oxide, niobium oxide, cesium oxide, indium oxide, iridium oxide, barium strontium titanate (BST) or lead zirconate titanate (PZT).

In an embodiment, the data storing layer 110 includes a tunnel insulating layer, floating gate electrode, and inter-gate insulating layer that are sequentially stacked on the semiconductor layer 100.

Similar to the data storing layer 110 disposed under the word lines WL, data storing layers 110 are provided between the semiconductor layer 100 and the string selection lines SSL0 and SSL1 and function as gate insulating layers. In an embodiment, the gate insulating layer is formed to have the same structure as the data storing layer 110. For example, the tunnel insulating layer 111, the charge storing layer 113, and the blocking insulation layer 115 are sequentially stacked under the first and second string selection lines SSL0 and SSL1 and the ground selection line GSL. The gate insulating layer is provided between the ground selection line GSL and the semiconductor layer 100. As shown in FIG. 3, a portion of the gate insulating layer, which is located between the ground selection line GSL and the semiconductor layer 100, includes a single layer which is thinner than the data storing layer 110. According to an embodiment, another portion of the gate insulating layer, which is located between the ground selection line GSL and the semiconductor layer 100, include the tunnel insulating layer 111, the charge storing layer 113, and the blocking insulation layer 115 sequentially stacked on the semiconductor layer 100, like the data storing layer 110.

In an embodiment, channel doped regions 103 are formed between the second string selection line SSL1 and the first active region ACT1. Channel doped regions 103 are formed between the first string selection line SSL0 and the second active region ACT2. The formation of the channel doped regions 103 includes doping the first and second active regions ACT1 and ACT2 with impurities having the same conductivity type as the doped regions 101. Threshold voltages of the first and second string selection elements SST0 and SST1 can be adjusted by the formation of the channel doped region 103.

The channel doped region 103 has the same conductivity type as a conductivity type of the semiconductor layer 100 and has an impurity concentration higher than an impurity concentration of the semiconductor layer 100. For example, when the semiconductor layer 100 has a p-type, the formation of the channel doped region 103 includes an ion implantation process, in which p-type impurities, such as B or $BF_2$, are selectively injected into the first and second active regions ACT1 and ACT2.

In an embodiment, the channel doped region 103 is formed to decrease the threshold voltage of the second string selection elements SST1. For example, the formation of the channel doped region 103 includes implanting p-type impurities into the first and second active regions ACT1 and ACT2, forming a mask pattern to expose portions of the first and second active regions ACT1 and ACT2, and then selectively implanting n-type impurities using the mask pattern as an ion mask. According to an embodiment, the second string selection elements SST1 are formed on the portions exposed by the mask pattern.

In an embodiment, the channel doped region 103 is formed to increase the threshold voltage of the first string selection elements SST0. For example, the formation of the channel doped region 103 include forming a first halo region with p-type impurities after the formation of the first and second string selection lines SSL0 and SSL1, and forming a second halo region with p-type impurities. The second halo region is formed by injecting the p-type impurities at an implantation angle different from an implantation angle of the first halo region. In an embodiment, the first and second string selection lines SSL0 and SSL1 are formed of materials, whose work functions are different from each other, to make a threshold voltage difference between the first and second string selection elements SST0 and SST1.

In an embodiment, in the case in which the data storing layer 110 is interposed between the semiconductor layer 100 and the first or second string selection line SSL0 or SSL1, the threshold voltage of the first or second string selection element SST0 or SST1 can be adjusted using an electric method. For example, the threshold voltage of the first or second string selection element SST0 or SST1 can be changed by inducing a high voltage difference between the first or second string selection line SSL0 or SSL1 and the semiconductor layer 100. When the voltage difference is higher than a magnitude required to induce Fowler-Nordheim (FN) tunneling, electric charges can be injected into or emitted from the data storing layer 110, and therefore, the threshold voltage can be changed.

In an embodiment, the first and second string selection elements SST0 and SST1 include two field effect transistors whose gate length is substantially equal to a gate length of the memory cells MC.

According to an embodiment as shown in FIG. 3, the first string selection line SSL0 includes two first selection lines SSL0a and SSL0b Each of the lines SSL0a and SSL0b has a line width W substantially equal to a line width of the word lines WL. As the second string selection line SSL1, two second selection lines SSL1a and SSL1b are included. Each of the lines SSL1a and SSL1b has a line width W substantially equal to a line width of the word lines WL. According to an embodiment, the ground selection element is configured to include one ground selection line GSL, whose line width W' is greater than the line width W of the word line WL.

The two first selection lines SSL0a and SSL0b are disposed on the semiconductor layer 100 between the doped regions 101 disposed adjacent to each other. Each of the first selection lines SSL0a and SSL0b is formed to have substantially the same line width as the line width W of the word line WL. A distance between the first selection lines SSL0a and SSL0b is equal to or smaller than the line width W of the word lines WL. Similarly, the second selection lines SSL1a and SSL1b are formed to have the same feature as the first selection lines SSL0a and SSL0b in terms of line width and distance. For example, according to an embodiment, each of the second selection lines SSL1a and SSL1b is formed to have substantially the same line width as the line width W of the word line WL, and a distance between the second selection lines SSL1a and SSL1b is equal to or smaller than the line width W of the word lines WL.

A distance between the first and second string selection lines SSL0 and SSL1 is substantially equal to a distance D2 between the first string selection line SSL0 and one of the word line WL adjacent to the first string selection line SSL0. In an embodiment, the line width W of the word line WL is substantially equal to a distance D3 between the word lines WL.

When the first selection lines SSL0a and SSL0b are connected in common to a specific voltage source, the semiconductor layer 100 has an inversion region (or a channel region) under the first selection lines SSL0a and SSL0b. The channel region is extended to a region of the semiconductor layer 100 between the first selection lines SSL0a and SSL0b due to the presence of an electric fringe field. For example, the channel region generated under the first selection lines SSL0a and SSL0b has a width $L_{ch}$ greater than a sum of the line widths W of the first selection lines SSL0a and SSL0b. For example, the first string selection element SST0 has an increased effective channel length, so that a short channel effect can be prevented from occurring.

According to an embodiment as shown in FIG. 4, the first string selection line SSL0 includes two first selection lines SSL0a and SSL0b, each of the lines SSL0a and SSL0b having a line width W substantially equal to line widths of the word lines WL. A distance D1 between the first selection lines SSL0a and SSL0b is less than the line width W of word line WL. The line width W of the word line WL is substantially equal to a distance D3 between the word lines WL, and a distance D2 between the first string selection line SSL0 and one of the word line WL adjacent to the first string selection line SSL0 is greater than the distance D3 between the word lines WL.

Figure 5:
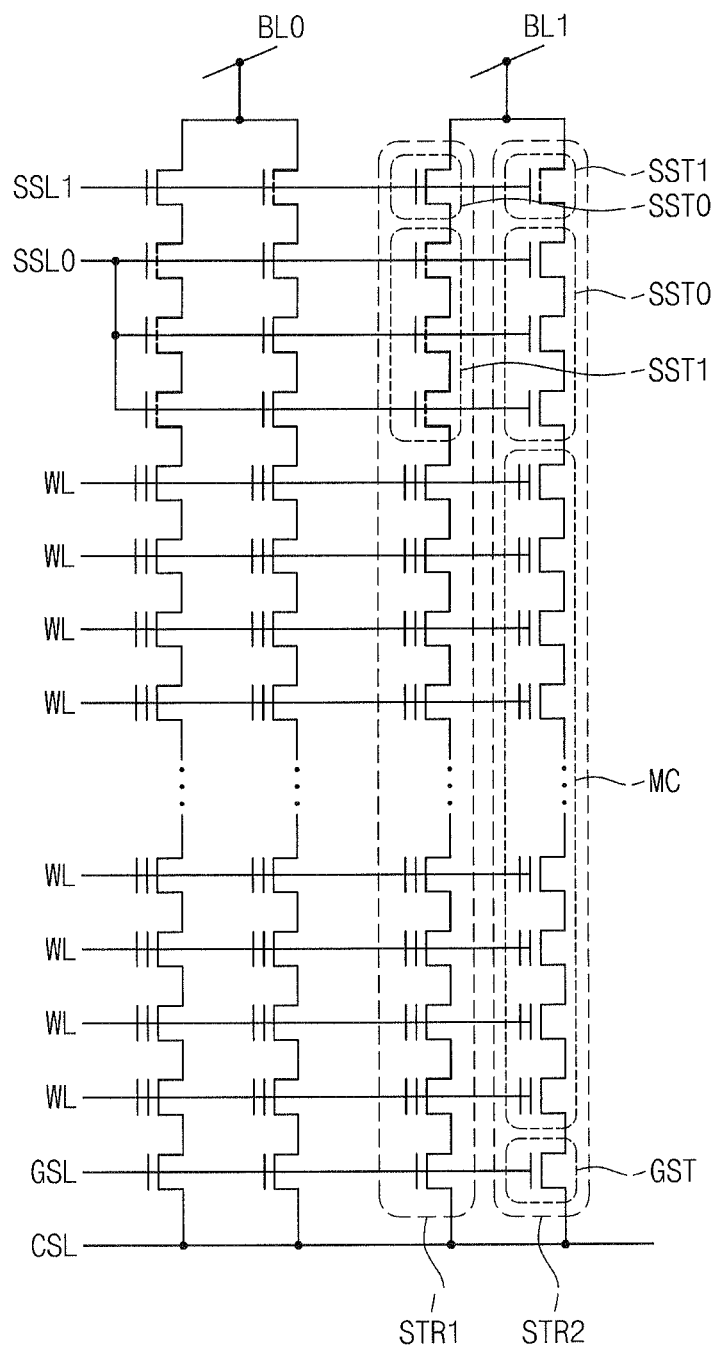
FIG. 5 is a circuit diagram of nonvolatile memory devices according to other modifications of the first embodiment of the inventive concept.
Figure 6:
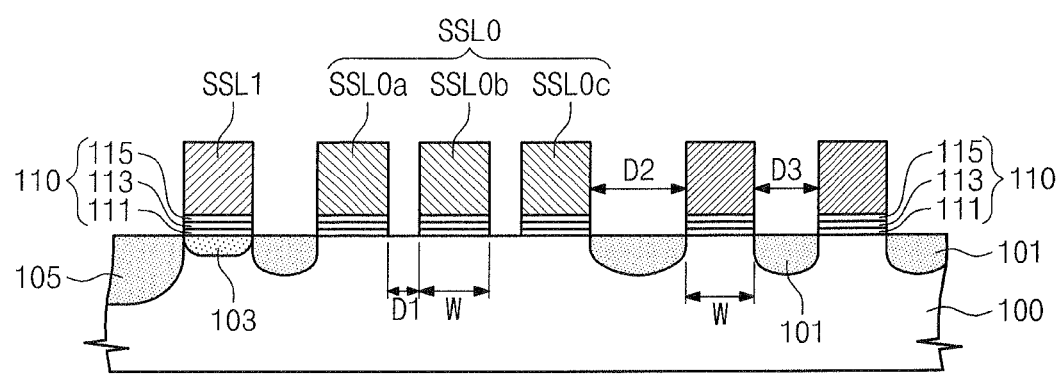
FIG. 6 is a sectional view of the nonvolatile memory devices according to other modifications of the first embodiment of the inventive concept.

FIGS. 5 and 6 are a circuit diagram and a sectional view illustrating a nonvolatile memory device according to an embodiment of the inventive concept.

Referring to FIGS. 5 and 6, as at least one of the first and second string selection elements SST0 and SST1, three field effect transistors are used that are connected in series with each other. In this case, the effective channel length $L_{ch}$ can be increased compared with the embodiment described in connection with FIG. 3. For example, according to an embodiment, when at least one of the string selection elements SST0 and SST1 are implemented with three field effect transistors, the effective channel length Lch can be larger than when each of the string selection elements SST0 and SST1 are implemented with two field effect transistors.

For example, three first selection lines SSL0a, SSL0b and SSL0c are disposed between two adjacent doped regions 101. A line width W of each first selection lines SSL0a, SSL0b and SSL0c is substantially equal to the line width W of the word line WL, and a distance D1 between adjacent two first selection lines of the first selection lines SSL0a, SSL0b and SSL0c is less than the line width W of each first selection lines SSL0a, SSL0b and SSL0c.

The second string selection element SST1 includes one field effect transistor. According to an embodiment, a line width W of the second selection line SSL1 is greater than the line width W of each first selection line SSL0a, SSL0b and SSL0c. Alternatively, the second string selection element SST1 includes a plurality of field effect transistors, like the first string selection element SST0.

Figure 7:
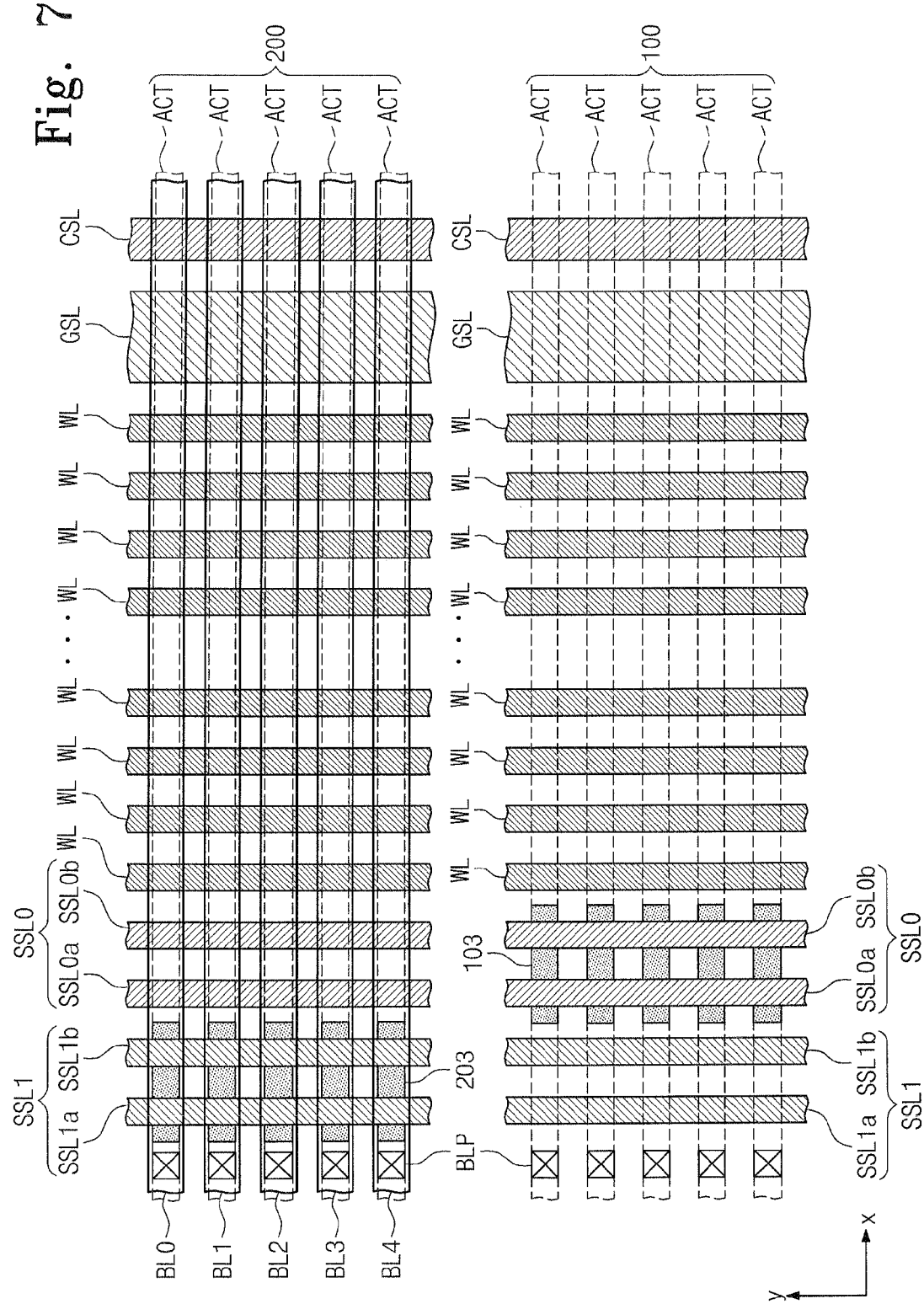
FIG. 7 is a plan view of nonvolatile memory devices according to a second embodiment of the inventive concept.
Figure 8:
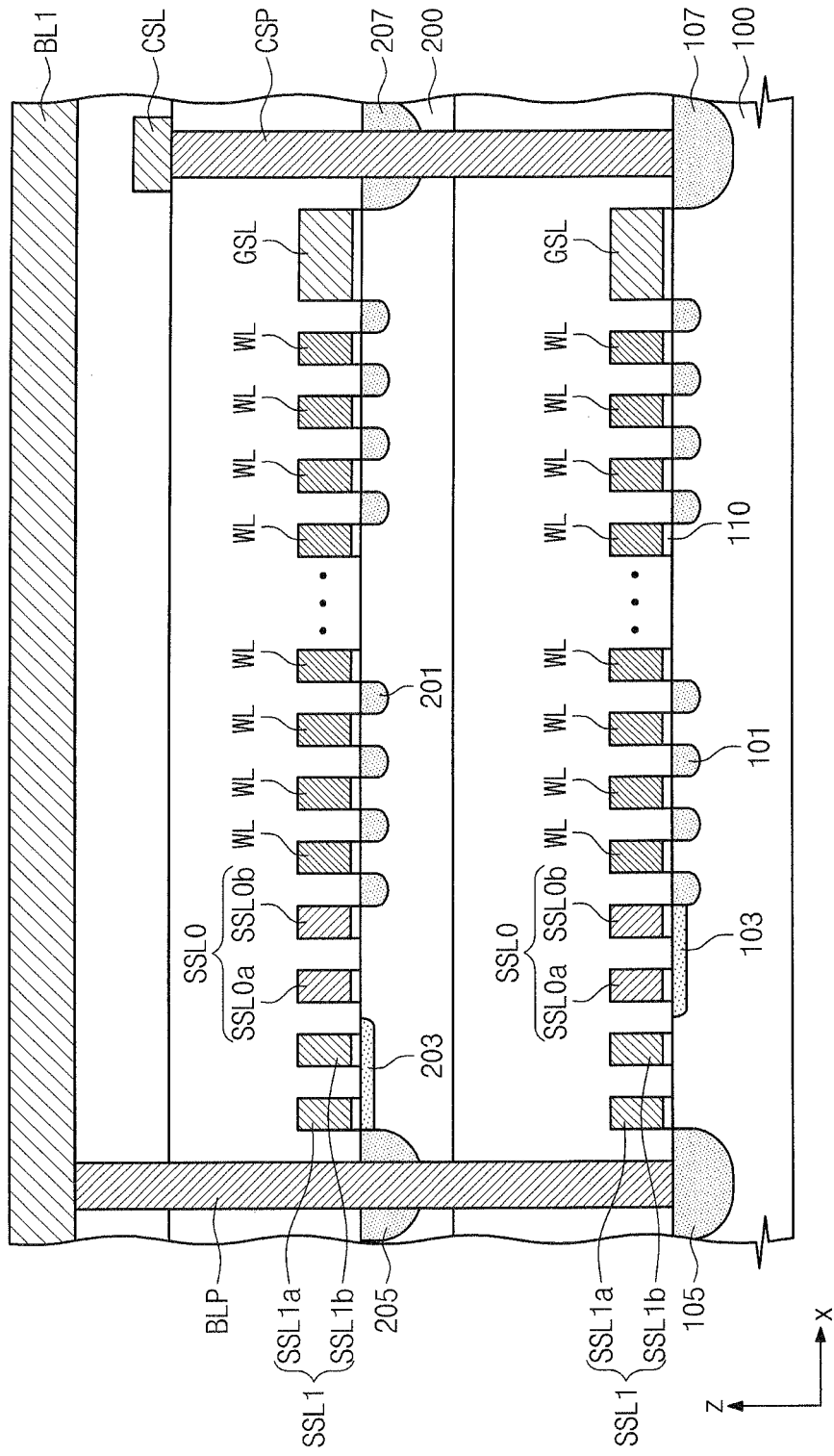
FIG. 8 is a sectional view of the nonvolatile memory devices according to the second embodiment of the inventive concept.

FIG. 7 is a plan view illustrating a nonvolatile memory device according to an embodiment of the inventive concept, and FIG. 8 is a sectional view illustrating a nonvolatile memory device according to an embodiment of the inventive concept.

A nonvolatile memory device according to an embodiment of the inventive concept is configured to have substantially the same technical features as the nonvolatile memory device described in connection with FIGS. 1 to 3 except for differences in structure that are described below.

The nonvolatile memory device described in connection with FIGS. 7 and 8 have the same or substantially the same as the nonvolatile memory device described in connection with FIGS. 1 to 3 in that, for example, two first and second cell strings STR1 and STR2 are connected in common to a corresponding one of the bit lines BL0 and BL1, and each of the first and second cell strings STR1 and STR2 includes a plurality of string selection elements, and one of the string selection elements has a different threshold voltage from another one of the string selection elements.

In an embodiment, the first cell string STR1 and the second cell string STR2 are vertically stacked. For example, as shown in FIGS. 7 and 8, the nonvolatile memory device includes first and second semiconductor layers 100 and 200 sequentially stacked in a vertical direction, e.g., in a z-axis direction, and the first and second cell strings STR1 and STR2 are realized on the first and second semiconductor layers 100 and 200, respectively. However, the exemplary embodiments of the inventive concept are not limited thereto. For example, according to an embodiment, the nonvolatile memory device has three or more semiconductor layers.

In an embodiment, the first semiconductor layer 100 includes a single crystalline silicon wafer, and the second semiconductor layer 200 includes a single crystalline silicon layer, which is epitaxially grown using the first semiconductor layer 100 (e.g., a wafer) as a seed layer.

Each of the first and second semiconductor layers 100 and 200 includes active regions ACT defined by device isolation layers. The active regions ACT are formed to be parallel to each other. The first and second string selection lines SSL0 and SSL1 and the ground selection line GSL are provided on each of the first and second semiconductor layers 100 and 200 to cross the active regions ACT, and a plurality of the word lines WL are provided between the first string selection line SSL0 and the ground selection line GSL to cross the active regions ACT.

Doped regions 101 and 201 are formed in the active regions ACT between the word lines WL. Drain regions 105 and 205 and source regions 107 and 207 are formed in the active regions ACT. The drain regions 105 and 205 are each formed at a side of the second string selection line SSL1, and the source regions 107 and 207 are each formed at a side of the ground selection line GSL.

Bit line plugs BLP are provided at a side of the second string selection line SSL0 and are connected to the drain regions 105 and 205, and at least one common source plug CSP is provided at a side of the ground selection line GSL and is connected to the source regions 107 and 207.

Each of the bit line plugs BLP is connected to a corresponding one of the bit lines BL0 and BL1. In an embodiment, the bit lines BL0 and BL1 are disposed over an uppermost one of the semiconductor layers (e.g., the second semiconductor layer 200) to cross the word lines WL.

In an embodiment, the common source plugs CSP are configured to electrically connect the source regions 107 with the first and second semiconductor layers 100 and 200. As a result, the source regions 107 are equipotential with the first and second semiconductor layers 100 and 200.

The bit line plug BLP and the common source plug CSP include at least one conductive material, and according to an embodiment, further include a conductive layer forming ohmic contact with the first and second semiconductor layers 100 and 200. In an embodiment, the bit line plug BLP and the common source plug CSP include at least one of a doped silicon layer, metal layers, silicide layers or metal nitride layers.

In an embodiment, the first string selection lines SSL0, which are disposed on the first and second semiconductor layers 100 and 200, respectively, are electrically connected with each other. Similarly, the second string selection lines SSL1, which are disposed on the first and second semiconductor layers 100 and 200, respectively, are electrically connected with each other. The ground selection lines GSL, which are disposed on the first and second semiconductor layers 100 and 200, respectively, are electrically connected with each other. The word lines WL located on the same vertical plane are electrically connected with each other.

Channel doped regions 103 and 203 are respectively formed in the first semiconductor layer 100 below the first string selection line SSL0 and the second semiconductor layer 200 below the second string selection line SSL1. Threshold voltages of the first string selection element SST0 can be adjusted by the channel doped regions 103 and 203.

As described with reference to FIGS. 1 through 6, according to an embodiment, as each of the first string selection lines SSL0, two first selection lines SSL0a and SSL0b are used, and as each of the second string selection lines SSL1, two second selection lines SSL0a and SSL1b are used. In an embodiment, the first and second selection lines SSL0a, SSL0b, SSL1a and SSL1b have substantially the same line width as a line width of the word line WL, and a distance between the first selection lines SSL0a and SSL0b and a distance between the second selection lines SSL1a and SSL0b are equal to or smaller than the line width.

Figure 9:
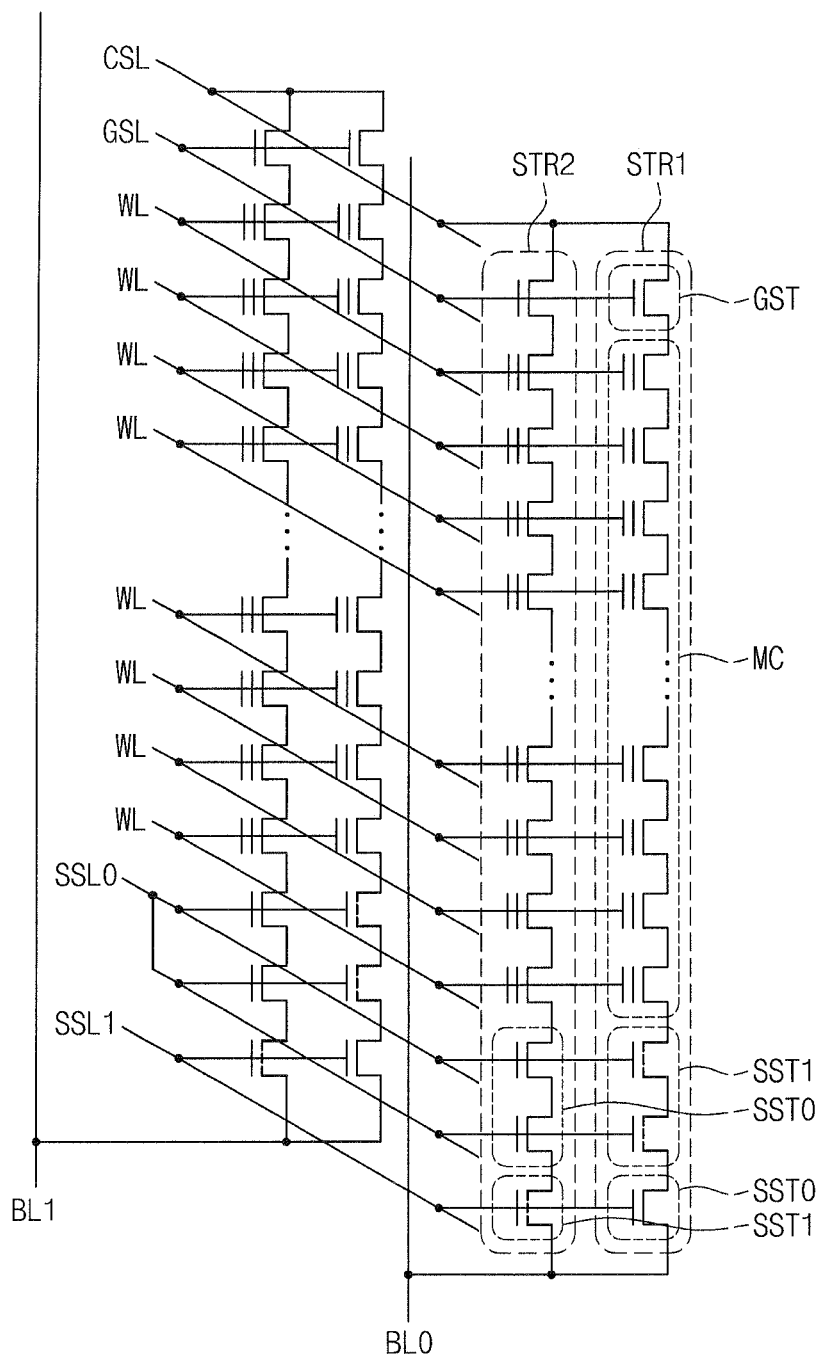
FIG. 9 is a circuit diagram of nonvolatile memory devices according to a third embodiment of the inventive concept.
Figure 10:
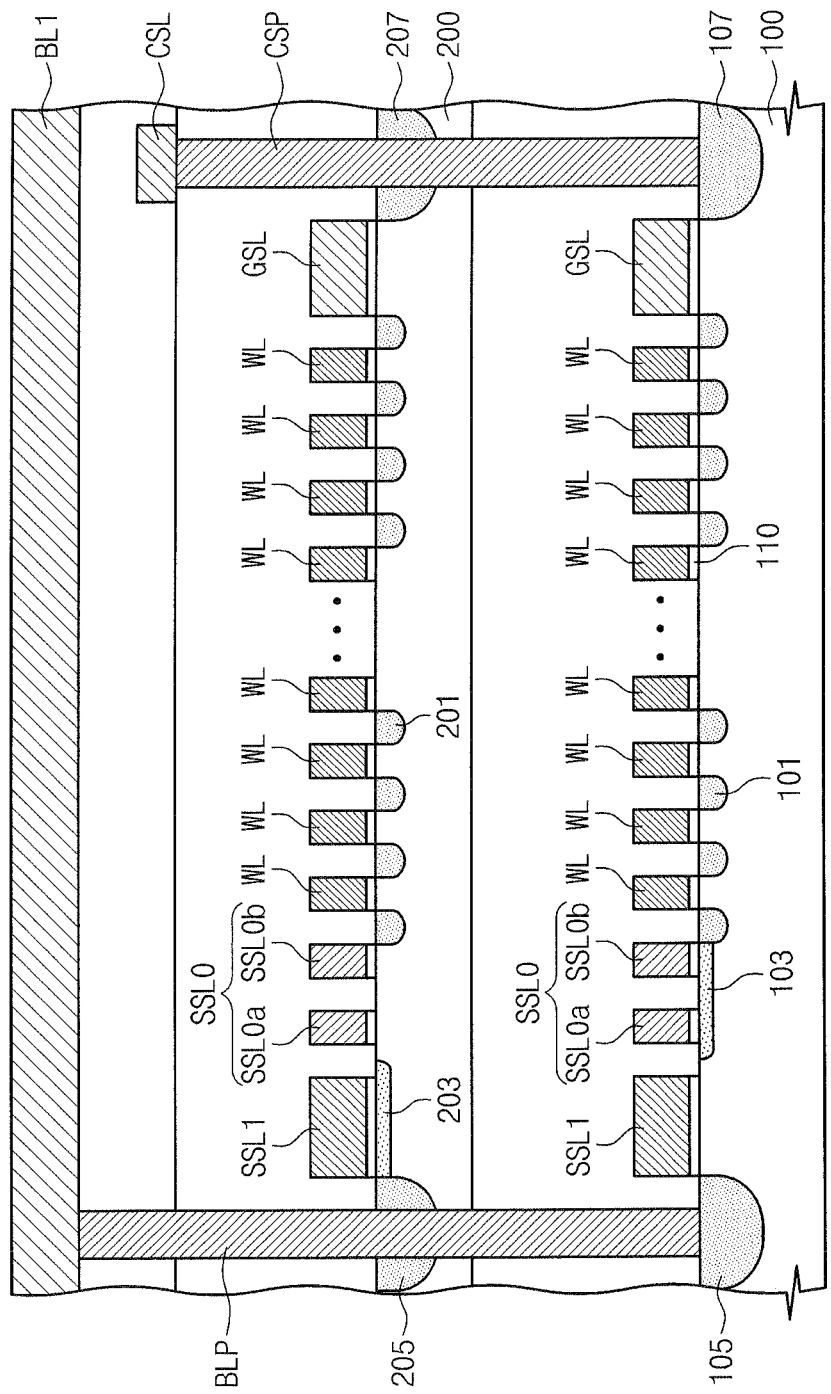
FIG. 10 is a sectional view of the nonvolatile memory devices according to the third embodiment of the inventive concept.

FIG. 9 is a circuit diagram illustrating a nonvolatile memory device according to an embodiment of the inventive concept, and FIG. 10 is a sectional view illustrating a nonvolatile memory device according to an embodiment of the inventive concept.

A nonvolatile memory device according to an embodiment of the inventive concept is configured to have substantially the same technical features as the nonvolatile memory device described in connection with FIGS. 7 and 8 except for differences in structure of string selection elements or lines that are described below.

For example, as shown in FIGS. 9 and 10, a first cell string STR1 includes a first string selection element SST0 realized by one field effect transistor and a second string selection element SST1 realized by a plurality of field effect transistors whose gate electrodes are jointly connected with each other. A second cell string STR2 includes a first string selection element SST0, which is realized by a plurality of field effect transistors whose gate electrodes are jointly connected with each other, and a second string selection element SST1 realized by one field effect transistor. For example, a first string selection line SSL0 includes two first selection lines SSL0a and SSL0b, and a second string selection line SSL1 includes one conductive line. In an embodiment, a line width of the second string selection line SSL1 is greater than a line width of each of the first selection lines SSL0a and SSL0b. The ground selection line GSL functions as or is connected to gate electrodes of the ground selection elements GST in the first and second cell strings STR1 and STR2. A line width of the ground selection line GSL is greater than a line width of the word line WL.

Figure 11:
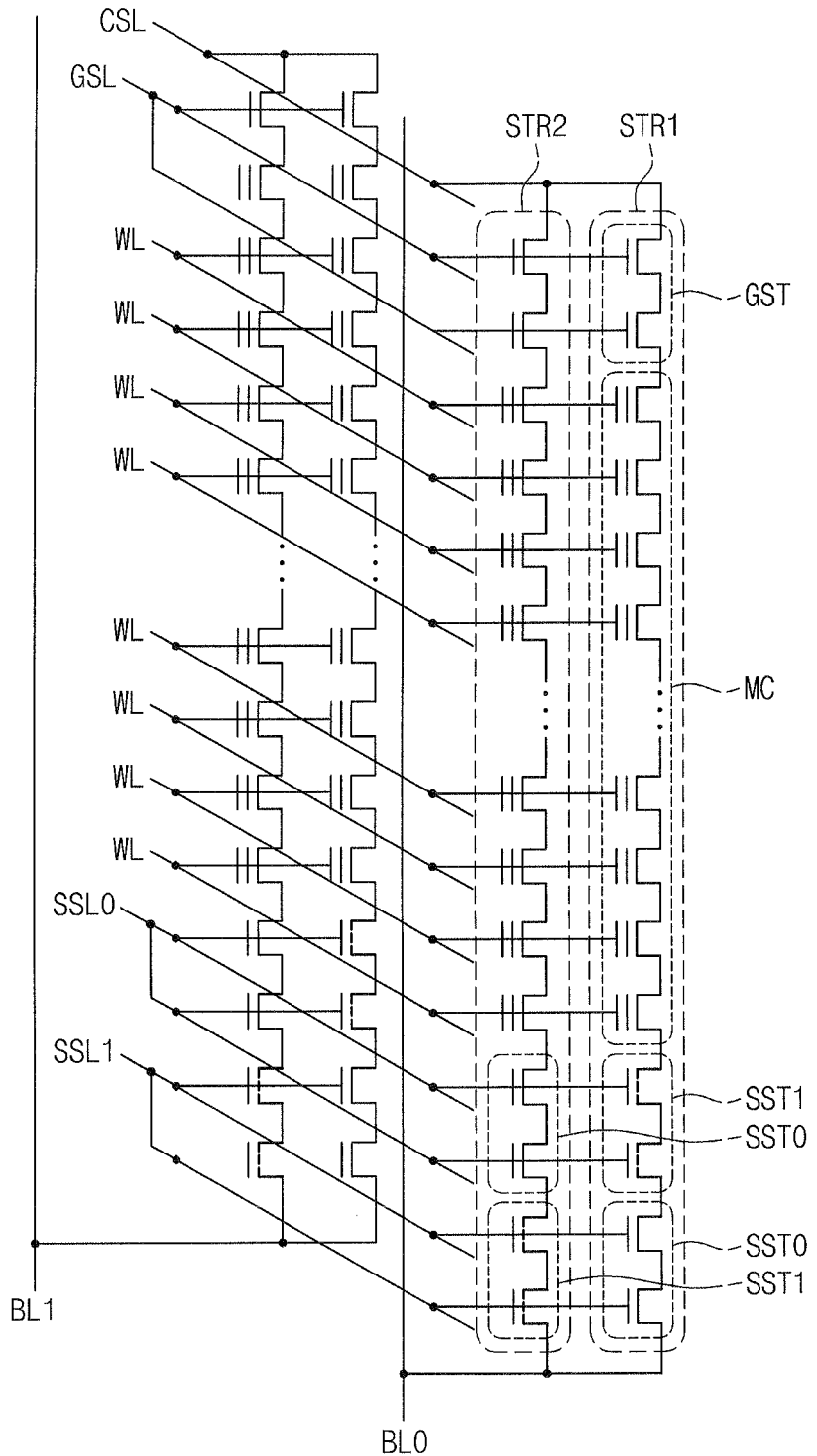
FIG. 11 is a circuit diagram of nonvolatile memory devices according to a fourth embodiment of the inventive concept.
Figure 12:
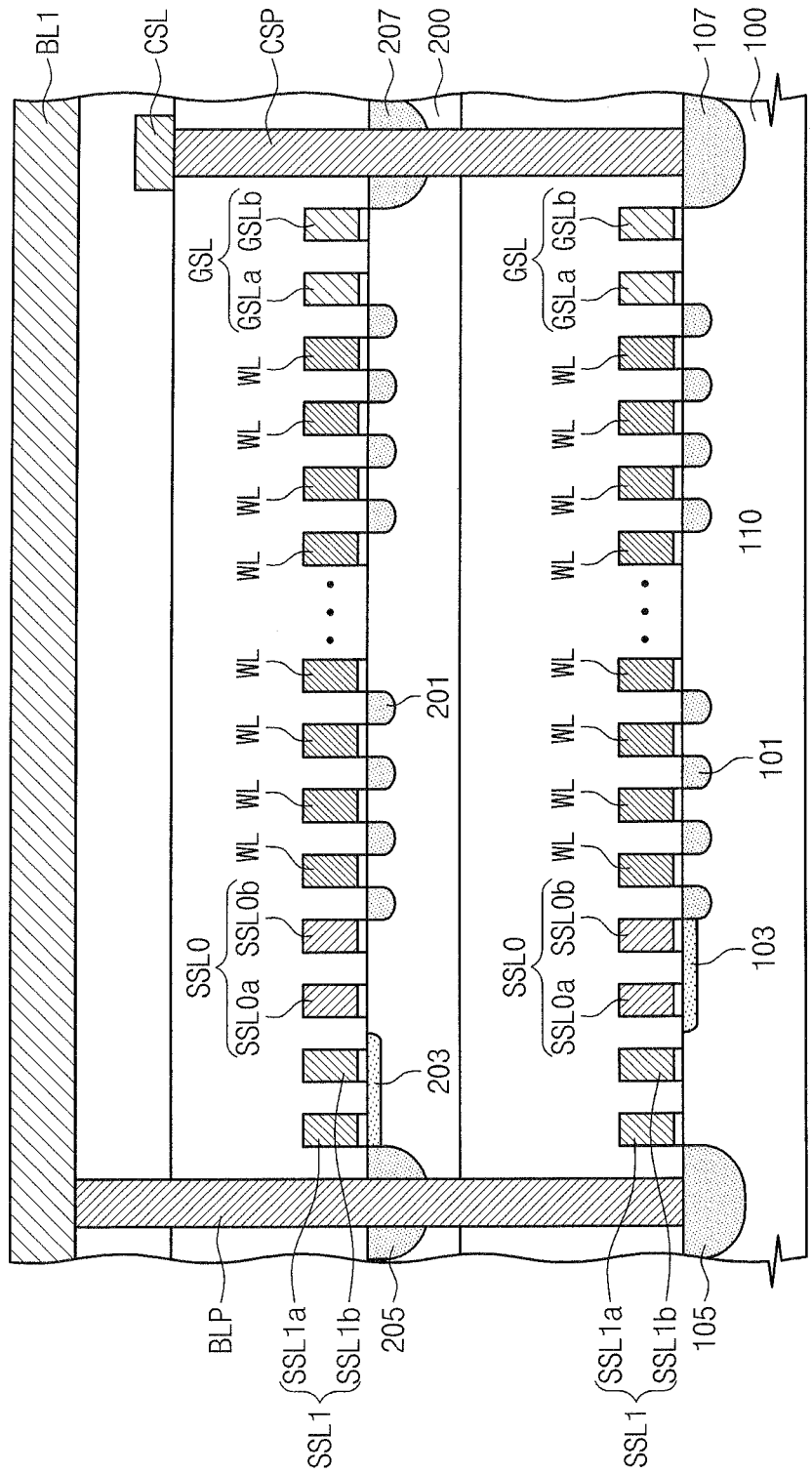
FIG. 12 is a sectional view of the nonvolatile memory devices according to the fourth embodiment of the inventive concept.

FIG. 11 is a circuit diagram illustrating a nonvolatile memory device according to an embodiment of the inventive concept, and FIG. 12 is a sectional view illustrating a nonvolatile memory device according to an embodiment of the inventive concept.

A nonvolatile memory device according to an embodiment of the inventive concept is configured to have substantially the same technical features as the nonvolatile memory described in connection with FIGS. 7 and 8 except for differences in structure of ground selection element that are described below. According to an embodiment, the ground selection element GST includes a plurality of field effect transistors whose gate electrodes are connected to each other. For example, the ground selection line GSL includes two conductive lines, like the first and second string selection lines SSL0 and SSL1. A line width of the conductive lines included in the ground selection line GSL is substantially equal to a line width of the word line WL, and a distance between the conductive lines is equal to or smaller than the line width of the conductive lines.

Hereinafter, a method of operating a nonvolatile memory device according to an exemplary embodiment of the inventive concept is described with reference to FIGS. 13 through 15.

Figure 13:
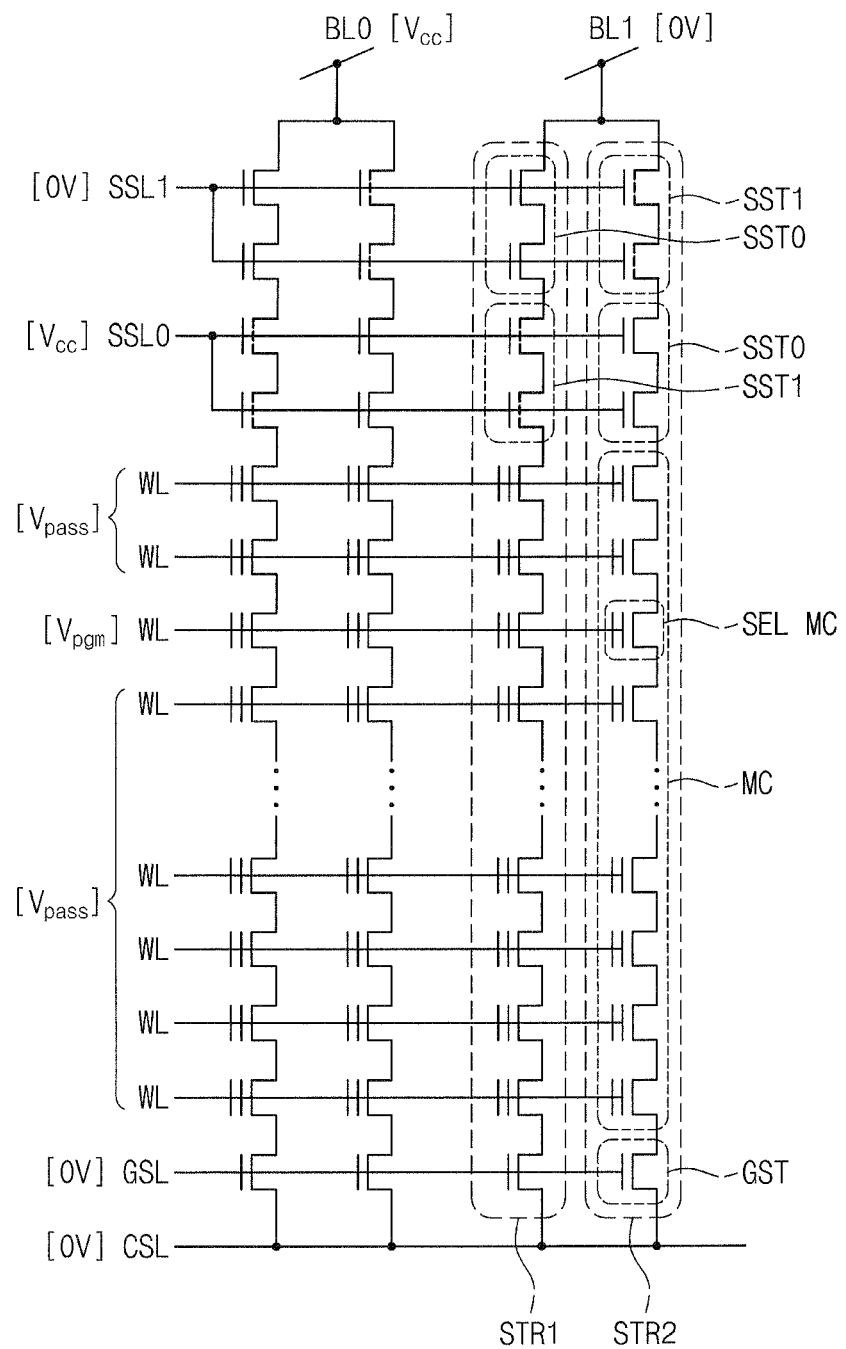
FIGS. 13 through 15 are diagrams illustrating a method of operating a nonvolatile memory device according to an exemplary embodiment of the inventive concept.
Figure 14:
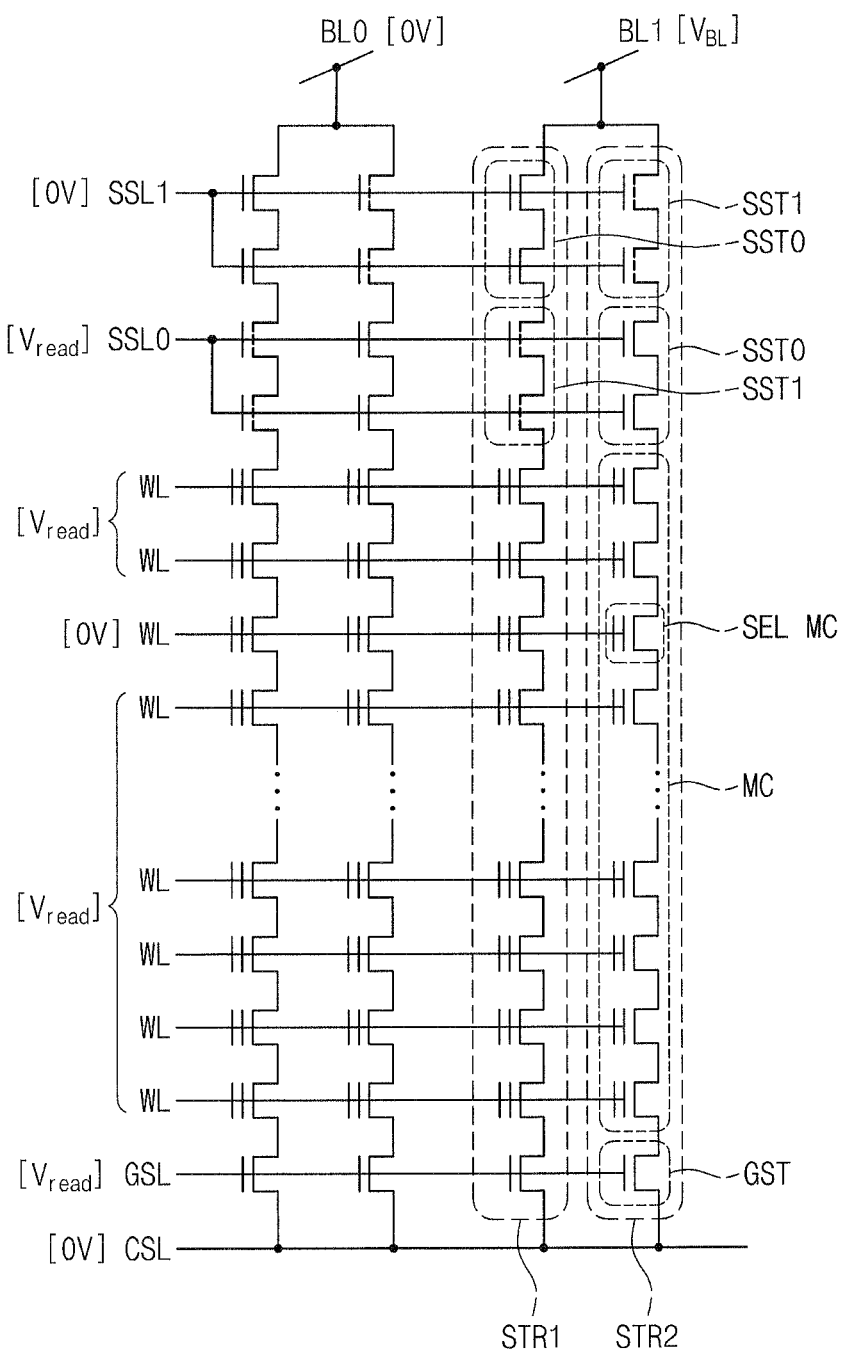
Figure 15:
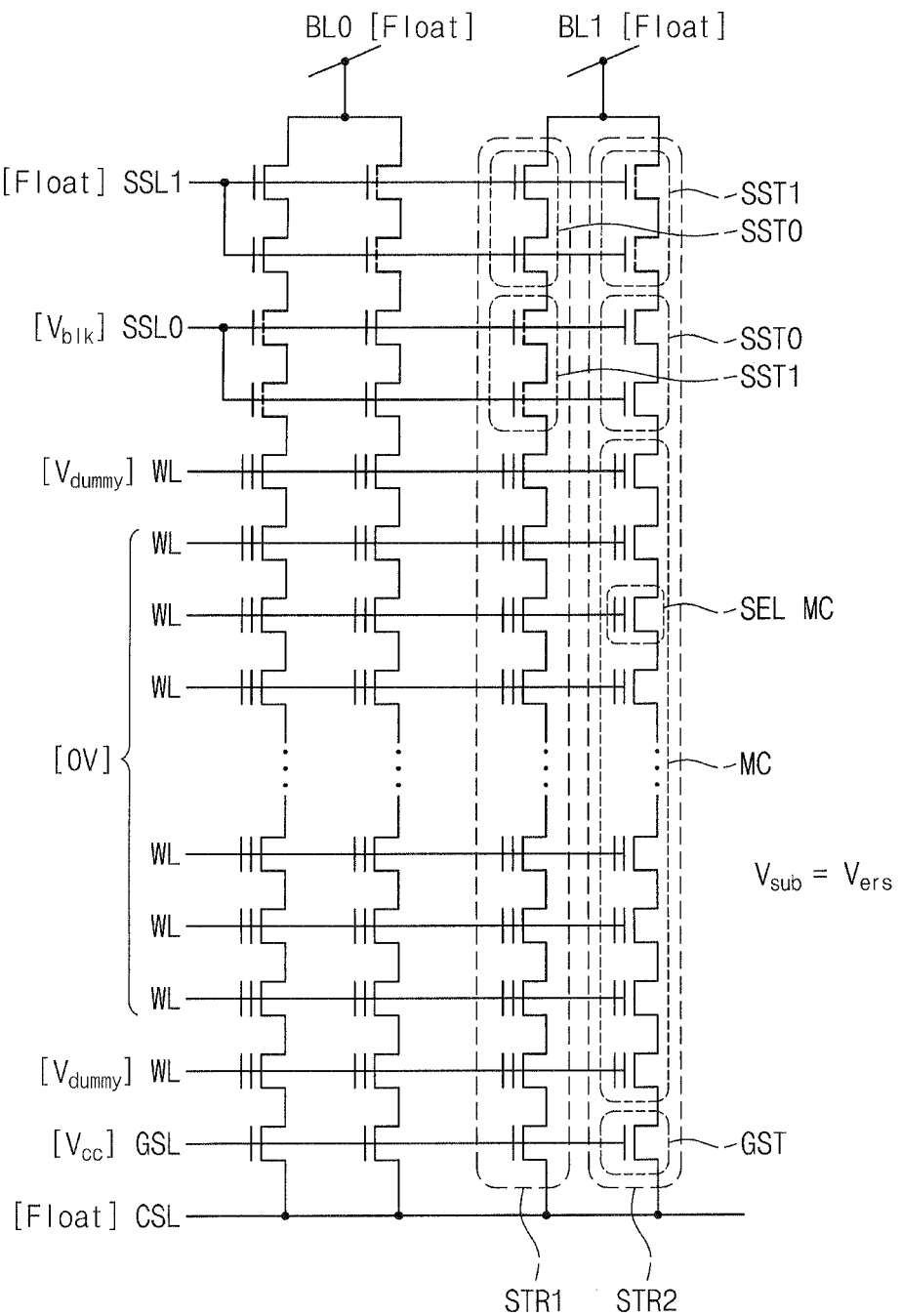

FIGS. 13 through 15 show program, read, and erase operations, respectively, of a nonvolatile memory device according to an exemplary embodiment of the inventive concept.

Referring to FIG. 13, a programming operation includes connecting a selected one of the cell strings to a selected bit line and then storing data into one of memory cells in the selected cell string. For simplicity, an example of a programming operation is described which is configured to connect the second cell string STR2 with the second bit line BL1 and to write datum into a memory cell SEL MC which is selected from the memory cells MC in the second cell string STR2.

According to an embodiment, each of the cell strings includes the first and second string selection elements SST0 and SST1. According to an embodiment, a threshold voltage of the first string selection element SST0 is higher than a threshold voltage of the second string selection element SST1. For example, the first string selection element SST0 includes an enhancement-mode FET, and the second string selection element SST1 includes a depletion-mode FET.

According to an embodiment, a ground voltage (e.g., 0V) is applied to the selected second bit line BL1, and a power voltage Vcc is applied to the unselected bit lines BL0. The ground voltage of 0V is applied to the ground selection line GSL and the common source line CSL.

A program voltage Vpgm is applied to the selected word line WL, and a pass voltage Vpass is applied to the unselected word lines WL. The program voltage Vpgm is selected to be able to induce Fowler-Nordheim (FN) tunneling in the selected memory cell. For example, a voltage enough to create FN tunneling in the memory cell SEL MC is selected as the program voltage Vpgm. The pass voltage Vpass is selected within a range of voltages that are lower than the program voltage Vpgm and higher than the threshold voltages of memory cells MC.

Voltages of the first and second string selection lines SSL0 and SSL1 are biased to turn on both of the first and second string selection elements SST0 and SST1 of the selected second cell string STR2. For example, the power voltage Vcc is applied to the first string selection line SSL0, and the ground voltage 0V is applied to the second string selection line SSL1. Then, the first and second string selection elements SST0 and SST1 of the second cell string STR2 are turned-on, and the memory cells MC of the second cell string STR2 can be electrically connected to the second bit line BL1.

When the power voltage Vcc is applied to the first string selection line SSL0, and the ground voltage 0V is applied to the second string selection line SSL1, the first string selection element SST0 of the unselected first cell string STR1 is turned off. Accordingly, the first cell string STR1 is electrically isolated from the common source line CSL and the second bit line BL1.

For the unselected bit lines BL0, the first cell string STR1 is electrically isolated from the unselected bit lines BL0 due to the presence of the turn-off string selection element, and the second cell string STR2 is self-boosted by the power voltage Vcc. Accordingly, the memory cells MC of unselected cell strings can be prevented from being unintentionally programmed.

A method of reading a nonvolatile memory device according to an exemplary embodiment of the inventive concept is described with reference to FIG. 14.

Referring to FIG. 14, for simplicity, an example of a reading operation is described which is configured to connect the second cell string STR2 with the second bit line BL1 and to read out data from the selected memory cell SEL MC in the second cell string STR2.

In an embodiment, a bit line voltage $V_{BL}$ of about 0.4 to about 0.9V is applied to the selected second bit line BL1, and a ground voltage 0V is applied to the unselected bit lines BL0. The ground voltage 0V is applied to the common source line CSL, and a read voltage Vread is applied to the ground selection lines GSL. Thus, a channel of the selected memory cell SEL MC can be connected to the common source line CSL. The ground voltage is applied to the selected word line WL, and a read voltage Vread is applied to the unselected the word lines WL. The read voltage Vread is selected to be able to turn on the unselected memory cell transistors. For example, a voltage enough to turn on the unselected memory cell transistors is selected as the read voltage Vread.

Voltages of the first and second string selection lines SSL0 and SSL1 are biased to turn on both of the first and second string selection elements SST0 and SST1 of the selected second cell string STR2. For example, the power voltage Vcc is applied to the second string selection line SSL0, and the ground voltage 0V is applied to the second string selection line SSL1. The second bit line BL1 and the second cell string STR2 are electrically connected to each other, and the first string selection element SST0 of the unselected first cell string STR1 is turned off such that the first cell string STR1 is electrically isolated from the second bit line BL1.

The selected memory cell SEL MC is turned on or off depending on data stored in the selected memory cell SEL MC. When the selected memory cell SEL MC is turned on, an electric current can be flowed through the selected second cell string STR2 and be detected by a sensing amplifier connected to the selected second bit line BL1.

A method of erasing a nonvolatile memory device according to an exemplary embodiment of the inventive concept is described with reference to FIG. 15.

In an embodiment, the erase operation is performed to discharge electric charges from the memory cells MC to the semiconductor layer 100. For example, the erase operation includes injecting electric charges, whose polarity is opposite to a polarity of electric charges stored in the memory cells MC, into the memory cells MC. In an embodiment, the erase operation is performed to erase one of the memory cells MC or to erase a plurality of the memory cells MC at the same time, for example, on a per-block basis.

Referring to FIG. 15, during the erase operation, the first and second string selection lines SSL0 and SSL1 have voltages that are selected to prevent the cell strings STR1 and STR2 from being electrically connected to the bit lines BL0 and BL1. For example, all the string selection lines are in an electrically floated state. An erase voltage Vers is applied to the common source line CSL, and the ground voltage 0V is applied to the word lines WL, and a voltage (e.g., Vcc), which is high enough to turn on the ground selection element GST, is applied to the ground selection line GSL. The erase voltage Vers (e.g., about 18V to about 20V) is applied to the semiconductor layers 100.

Thus, all the memory cells MC in the cell strings are erased by the Fowler-Nordheim (FN) tunneling. For example, electrons are emitted from the memory cells MC to the semiconductor layer 100 or holes are injected from the semiconductor layer 100 to the memory cells MC.

During the erase operation, a high voltage difference is generated between the semiconductor layer 100 and the word lines WL. According to an embodiment, the string and ground selection lines SSL0, SSL1 and GSL are capacitively coupled with the word lines WL to have electric potentials different from an electric potential of the semiconductor layer 100, for example, when the string and ground selection lines SSL0, SSL1 and GSL are in an electrically floated state. Thus, holes may be accumulated in the selection elements, which may deteriorate reliability of the memory device.

To avoid this, the erase voltage Vers is applied to the semiconductor layer 100, and a dummy voltage $V_{dummy}$ is applied to the word lines WL adjacent to the first string selection line SSL0 and the ground selection line GSL. The dummy voltage $V_{dummy}$ is higher than 0V and lower than the erase voltage Vers. Thus, an electric field exerted to the first string selection element SST0 and ground selection element GST can be reduced. A blocking voltage Vblk is applied to the first string selection line SSL0. The blocking voltage Vblk is higher than 0V and lower than the dummy voltage $V_{dummy}$.

Thus, the hole tunneling occurs under the word lines WL applied with a voltage of 0V and is prevented from occurring under the word line WL applied with the dummy voltage $V_{dummy}$.

Due to the blocking voltage Vblk applied to the first string selection line SSL0, it is possible to decrease a voltage difference between the first string selection line SSL0 and the semiconductor layer 100, thus suppressing a deterioration in reliability, which may result from the hole accumulation in the string selection element.

Figure 16:
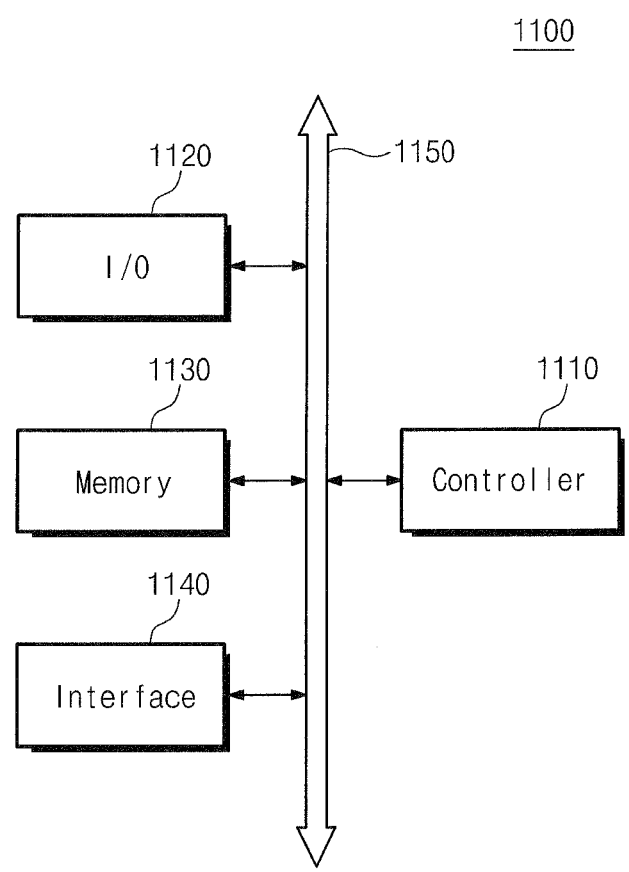
FIG. 16 is a block diagram exemplarily illustrating a memory system including at least one of the nonvolatile memory devices according to exemplary embodiments of the inventive concept.

FIG. 16 is a block diagram exemplarily illustrating a memory system including at least one nonvolatile memory device according to an exemplary embodiment of the inventive concept.

Referring to FIG. 16, a memory system 1100 can be applied to a personal digital assistant (PDA), a portable computer, a web tablet, a wireless phone, a mobile phone, a digital music player, a memory card and/or all the devices that can transmit and/or receive data in a wireless communication environment.

The memory system 1100 includes a controller 1110, an input/output device 1120, such as a keypad and a display device, a memory 1130, an interface 1140 and a bus 1150. The memory 1130 and the interface 1140 communicate with each other through the bus 1150.

The controller 1110 includes at least one microprocessor, at least one digital signal processor, at least one micro controller or other process devices similar to the microprocessor, the digital signal processor and the micro controller. The memory 1130 is used to store an instruction executed by the controller 1110. The input/output device 1120 can receive data or a signal from the outside of the system 1100 or can transmit data or a signal to the outside of the system 1100. For example, the input/output device 1120 includes a keyboard, a keypad and/or a displayer.

The memory 1130 includes at least one nonvolatile memory device according to an exemplary embodiment of the inventive concept. The memory 1130 further includes a different kind of memory, a volatile memory device capable of random access and various kinds of memories.

The interface 1140 transmits data to a communication network or receives data from a communication network.

A nonvolatile memory device according to an embodiment of the inventive concept or a memory system comprising the nonvolatile memory device is packaged in various kinds of ways, such as, for instance, a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink. Small Outline Package (SSOP), Thin Small Outline Package (TSOP), System In Package (SIP), Multi Chip Package (MCP), Wafer-level Fabricated Package (WFP), or Wafer-level Processed Stack Package (WSP). The package in which the nonvolatile memory device according to an embodiment is mounted further includes at least one semiconductor device (e.g., a controller and/or a logic device) that controls the nonvolatile memory device.

Figure 17:
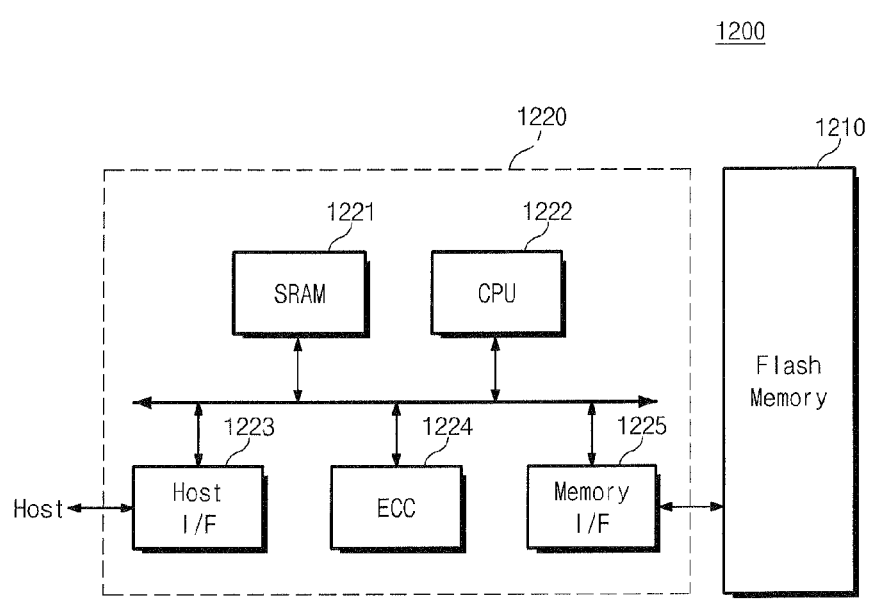
FIG. 17 is a block diagram exemplarily illustrating a memory card including at least one of the nonvolatile memory devices according to exemplary embodiments of the inventive concept.

FIG. 17 is a block diagram illustrating a memory card including at least one nonvolatile memory device according to an exemplary embodiment of the inventive concept.

Referring to FIG. 17, the memory card 1200 for supporting large-capacity storage includes a semiconductor memory device 1210, which includes a nonvolatile memory device according to an exemplary embodiment of the inventive concept. The memory card 1200 includes a memory controller 1220 controlling each or every data exchange between a host and the semiconductor memory device 1210.

A static random access memory (SRAM) 1221 is used as an operation memory of a processing unit 1222. A host interface (I/F) 1223 includes data exchange protocols of a host to be connected to the memory card 1200. An error correction block (ECC) 1224 detects and corrects errors included in data read out of a multi bit semiconductor memory device 1210. A memory interface (I/F) 1225 interfaces with the semiconductor memory device 1210. The processing unit (CPU) 1222 performs each or every control operation for exchanging data of the memory controller 1220. Even though not depicted in drawings, it is apparent to one of ordinary skill in the art that the memory card 1200 according to an exemplary embodiment of the inventive concept further includes a ROM ((not shown)) storing code data for interfacing with the host.

Figure 18:
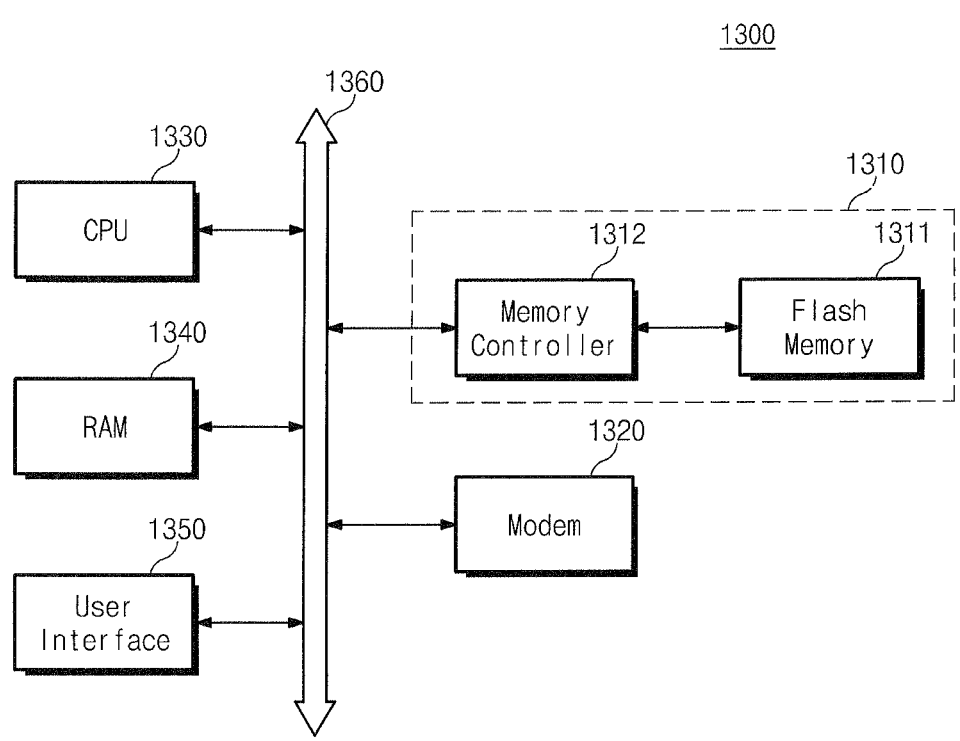
FIG. 18 is a block diagram exemplarily illustrating an information processing system including at least one of the nonvolatile memory devices according to exemplary embodiments of the inventive concept.

FIG. 18 is a block diagram illustrating an information processing system including at least one nonvolatile memory device according to an exemplary embodiment of the inventive concept.

Referring to FIG. 18, an information processing system 1300 includes a memory system 1310 including at least one nonvolatile memory device according to an exemplary embodiment of the inventive concept. For instance, the information processing system 1300 includes a mobile device and/or a desktop computer. In an embodiment, the information processing system 1300 further includes a modem 1320, a central processing unit (CPU) 1330, a random access memory (RAM) 1340, and a user interface 1350, which are electrically connected to a system bus 1360. The memory system 1310 includes a memory device 1311 and a memory controller 1312. In an embodiment, the memory system 1310 is configured identical or substantially identical to the memory card 1200 described with reference to FIG. 17. Data processed by the CPU 1330 and/or input from an outside source is stored in the memory system 1310. In an embodiment, the memory system 1310 is used as a portion of a solid state drive (SSD), and according to an embodiment, the information processing system 1300 stably and reliably stores a large amount of data in the memory system 1310. According to an embodiment, for example, an application chipset, a camera image sensor, a camera image signal processor (ISP), or an input/output device is included in the information processing system 1300.

According to the exemplary embodiments of the inventive concept, a nonvolatile memory device is configured to include a single bit line shared by a plurality of cell strings. Thus, an integration density of the nonvolatile memory device can be increased. Each cell string is configured to include string selection elements whose threshold voltages are different from each other, such that the bit line can be selectively connected to one of the plurality of cell strings.

Each of string selection elements includes a plurality of field effect transistors whose gate electrodes are connected in common to each other, which can lead to an increase in an effective channel length of the string selection element. As a result, it is possible to suppress short channel effects (e.g., leakage current) from occurring in the string selection elements, and thus, the nonvolatile memory device can have improved reliability.

While exemplary embodiments of the inventive concept have been particularly shown and described, it will be understood by one of ordinary skill in the art that variations in form and detail may be made therein without departing from the spirit and scope of the attached claims.

What is claimed is:

1. A memory device comprising a plurality of cell strings, wherein the plurality of cell strings are configured to share a bit line and word lines,
   wherein at least one of the cell strings comprises a plurality of memory cells connected in series to each other and a string selection device configured to control connections between the memory cells and the bit line, and wherein the string selection device comprises:
      a first string selection element having a first threshold voltage; and
      a second string selection element connected in series to the first string selection element, the second string selection element having a second threshold voltage different from the first threshold voltage, and
   wherein at least one of the first and second string selection elements comprises a plurality of switching elements connected in series to each other, wherein the memory cells comprise a data storing layer provided between the word lines and a semiconductor layer, and wherein the plurality of switching elements respectively comprise gate electrodes, respectively on the semiconductor layer and gate insulating layers, respectively, between the gate electrodes and the semiconductor layer, and
   at least one of data storing layer and the gate insulating, layer comprises a tunnel insulating layer, a charge storing layer, and a blocking insulation layer sequentially stacked on the semiconductor layer.

2. The memory device of claim 1, wherein the gate electrodes of the plurality of switching elements are connected in common to each other.

3. The memory device of claim 1, wherein a selection line is connected in common to the first and second string selection elements of different cell strings of the cell strings.

4. The memory device of claim 3, wherein one of the plurality of cell strings is electrically connected to the bit line when the first and second string selection elements of a cell string selected from the cell strings are turned on.

5. A memory device comprising a plurality of cell strings, wherein the plurality of cell strings are configured to share a bit line and word lines,
   wherein at least one of the cell strings comprises a plurality of memory cells connected in series to each other and a string selection device configured to control connections between the memory cells and the bit line, and wherein the string selection device comprises:
      a first string selection element having a first threshold voltage; and
      a second string selection element connected in series to the first string selection element, the second string selection element having a second threshold voltage different from the first threshold voltage, and
   wherein at least one of the first and second string selection elements comprise a plurality of switching elements connected in series to each other, wherein gate electrodes of the plurality of switching elements are connected in common to each other, and wherein source and drain electrodes of the plurality of switching elements include inversion regions which are formed in a semiconductor layer between the gate electrodes by an electric fringe field from the gate electrodes.

6. A memory device comprising a plurality of cell strings, wherein the plurality of cell strings are configured to share a bit line and word lines, wherein at least one of the cell strings comprises a plurality of memory cells connected in series to each other and a string selection device configured to control connections between the memory cells and the bit line, and wherein the string selection device comprises:
- a first string selection element having a first threshold voltage; and
- a second string selection element connected in series to the first string selection element, the second string election selection element having a second threshold voltage different from the first threshold voltage, and wherein at least one of the first and second string selection elements comprises a plurality of switching elements connected in series to each other, wherein the memory cells comprise a data storing layer provided between the word lines and a semiconductor layer, and wherein at least one of the first and second string selection elements comprises:
- a plurality of string selection lines provided on the semiconductor layer; and
- a gate insulating layer provided between the string selection lines and the semiconductor layer, wherein
- a width of at least one of the string selection lines is substantially equal to widths of the word lines.

7. The memory device of claim 6, wherein a distance between the string selection lines is substantially equal to or smaller than widths of the word lines.

8. A memory device comprising a plurality of cell strings, wherein the plurality of cell strings are configured to share a bit line and word lines,
wherein at least one of the cell string comprises a plurality of memory cells connected in series to each other and a string selection device configured to control connection between the memory cells and the bit line, and wherein the string selection device comprises:
- a first string selection element having a first threshold voltage; and
- a second string selection element connected in series to the first string selection element, the second string selection element having a second threshold voltage different from the first threshold voltage, and wherein at least one of the first and second string selection elements comprises a plurality of switching elements connected in series to each other, wherein the first string selection element comprises a plurality of first string selection lines provided on the semiconductor layer and a gate insulating layer provided between the first string selection lines and the semiconductor layer, and the second string selection element comprises a second string selection line provided on the semiconductor layer and a gate insulating layer provided between the second string selection line and the semiconductor layer, wherein
a width of the second string selection line is greater than widths of the first string selection lines.

9. A memory device comprising a plurality of cell strings, wherein the plurality of cell strings are configured to share a bit line and word lines,
wherein at least one of the cell sting comprises a plurality of memory cells connected in series to each other and a string selection device configured to control connections between the memory cells and the bit line, and wherein the string selection device comprises:
- a first string selection element having a first threshold voltage; and
- a second string selection element connected in series to the first string selection element, the second string selection element having a second threshold voltage different from the first threshold voltage, and wherein at least one of the first and second string selection elements comprises a plurality of switching elements connected in series to each other, wherein a selection line is connected in common to the first and second string selection elements of different cell strings of the cell strings, and wherein one of the plurality of cell strings is electrically connected to the bit line when the selection lines is applied with an operation voltage that is lower than the first threshold voltage and higher than the second threshold voltage.

10. A memory device comprising:
a first cell string including a first string selection element, a second string selection element, and a memory cell connected in series with each other;
a second cell string including a first string selection element, a second string selection element, and a memory cell connected in series with each other, wherein the first and second cell strings are jointly connected to a bit line and word lines;
a first string selection line connected to the first string selection element of the first cell string and the second string selection element of the second cell string; and
a second string selection line connected to the second string selection element of the first cell string and the first string selection element of the second cell string, wherein the first string selection element has a first threshold voltage, and the second string selection element has a second threshold voltage different from the first threshold voltage, wherein the memory cells comprise a data storing layer provided between the word lines and a semiconductor layer, and wherein
the first and second string selection elements respectively comprise gate electrodes, respectively, on the semiconductor layer and gate insulating layers, respectively, between the gate electrodes and the semiconductor layer, and
at least one of the data storing layer and the gate insulating layer comprises a tunnel, insulating layer, a charge storing layer, and a blocking insulation layer sequentially stacked on the semiconductor layer.

11. The memory device of claim 10, wherein the first string selection element includes two switching elements connected in series with each other, and the second string selection element includes two switching elements connected in series with each other, wherein the first string selection line is jointly connected to gate electrodes of the switching elements of the first string selection element, and the second string selection line is jointly connected to gate electrodes of the switching elements of the second string selection element.

12. The memory device of claim 10, wherein the first string selection element includes one switching element, and the second string selection element includes two or three switching elements connected in series with each other, wherein the first string selection line is connected to a gate electrode of the switching element of the first string selection element, and the second string selection line is jointly connected to gate electrodes of the switching elements of the second string selection element.

13. The memory device of claim 10, wherein the first cell string and the second cell string are vertically stacked on a substrate.

14. The memory device of claim 10, wherein the first and second string selection lines are applied with different voltages, respectively.

\* \* \* \* \*